(12) United States Patent
Kojima et al.

(10) Patent No.: US 7,632,613 B2
(45) Date of Patent: Dec. 15, 2009

(54) LEVENSON TYPE PHASE SHIFT MASK AND MANUFACTURING METHOD THEREOF

(75) Inventors: Yosuke Kojima, Niiza (JP); Toshio Konishi, Minamisaitama-gun (JP); Keishi Tanaka, Kasukabe (JP); Masao Otaki, Minamisaitama-gun (JP); Jun Sasaki, Kasukabe (JP)

(73) Assignee: Toppan Printing Co., Ltd., Tokyo (JP)

( * ) Notice: Subject to any disclaimer, the term of this patent is extended or adjusted under 35 U.S.C. 154(b) by 383 days.

(21) Appl. No.: 11/583,797

(22) Filed: Oct. 20, 2006

(65) Prior Publication Data

US 2007/0037072 A1    Feb. 15, 2007

Related U.S. Application Data

(63) Continuation of application No. PCT/JP2005/007437, filed on Apr. 19, 2005.

(30) Foreign Application Priority Data

Apr. 23, 2004    (JP)    ............................. 2004-128043

(51) Int. Cl.
    *G03F 1/00*    (2006.01)
(52) U.S. Cl. .......................................................... 430/5
(58) Field of Classification Search .................. 430/5, 430/394, 322; 716/19, 20, 21
    See application file for complete search history.

(56) References Cited

U.S. PATENT DOCUMENTS 6,458,495 B1 * 10/2002 Tsai et al. ....................... 430/5

7,067,221 B2 * 6/2006 Mesuda et al. ................ 430/5
2003/0226819 A1    12/2003 Tzu et al.
2003/0229879 A1    12/2003 Pierrat

FOREIGN PATENT DOCUMENTS

| JP | 63-293822 | 11/1988 |
| JP | 5-11433 | 1/1993 |
| JP | 5-53290 | 3/1993 |
| JP | 10-333316 | 12/1998 |
| JP | 2000-187315 | 7/2000 |
| JP | 2003-177511 | 6/2003 |
| JP | 2003-344987 | 12/2003 |

OTHER PUBLICATIONS

International Preliminary Report on Patentability, dated Oct. 25, 2006, PCT/IB/338, 373 and PCT/ISA/237.
European Search Report issued on Dec. 12, 2008 in corresponding European Patent Application 05734659.5.

* cited by examiner

*Primary Examiner*—Stephen Rosasco (57) ABSTRACT

A Levenson type phase shift mask has a light shielding portion and openings formed on a transparent substrate. The transparent substrate at the openings is partially dug in or a transparent film is partially disposed on the transparent substrate at the openings to form shifter openings and non-shifter openings. The shifter openings and the non-shifter openings repetitively exist in the mask. The shifter openings invert a phase of transmitted light. The Levenson type phase shift mask has a light shielding portions pattern interposed from both sides between the adjacent openings of the same kind. The light shielding portions pattern is subjected to bias correction which expands the light shielding portions pattern to both sides thereof in a predetermined amount with respect to a predetermined design line width set by a design of the mask.

8 Claims, 10 Drawing Sheets

PRIOR ART

LEVENSON TYPE PHASE SHIFT MASK AND MANUFACTURING METHOD THEREOF

CROSS-REFERENCE TO RELATED APPLICATIONS

This is a Continuation Application of PCT Application No. PCT/JP2005/007437, filed Apr. 19, 2005, which was published under PCT Article 21(2) in Japanese.

This application is based upon and claims the benefit of priority from prior Japanese Patent Application No. 2004-128043, filed Apr. 23, 2004, the entire contents of which are incorporated herein by reference.

BACKGROUND OF THE INVENTION

1. Field of the Invention

The present invention relates to a Levenson type phase shift mask used for manufacturing a semiconductor element such as an LSI and to a manufacturing method thereof.

2. Description of the Related Art

Recently, a high resolution quality has been demanded even in a projection exposure device in connection with increasing density and miniaturization of semiconductor elements. Thus, in the field of photomasks, there is a phase shift method proposed by Levenson et al. of IBM Corporation in 1982 as a technique for improving the resolution quality of a transcription pattern. The principle of the phase shift method is as follows: a phase shift portion (shifter opening) is provided in one opening so that the phase of transmitted light which has passed an adjacent opening is inverted, in order to decrease light density at a boundary portion when the transmitted lights interfere with each other, thereby improving the resolution quality and focal depth of the transcription pattern. A photomask whose resolution quality has been improved by use of such a phase shift method is generally called a Levenson type phase shift mask.

Currently, the main method of providing a phase shift portion in one opening is a digging type method in which a transparent substrate is dug by, for example, etching to provide a shifter opening.

Figure 8:
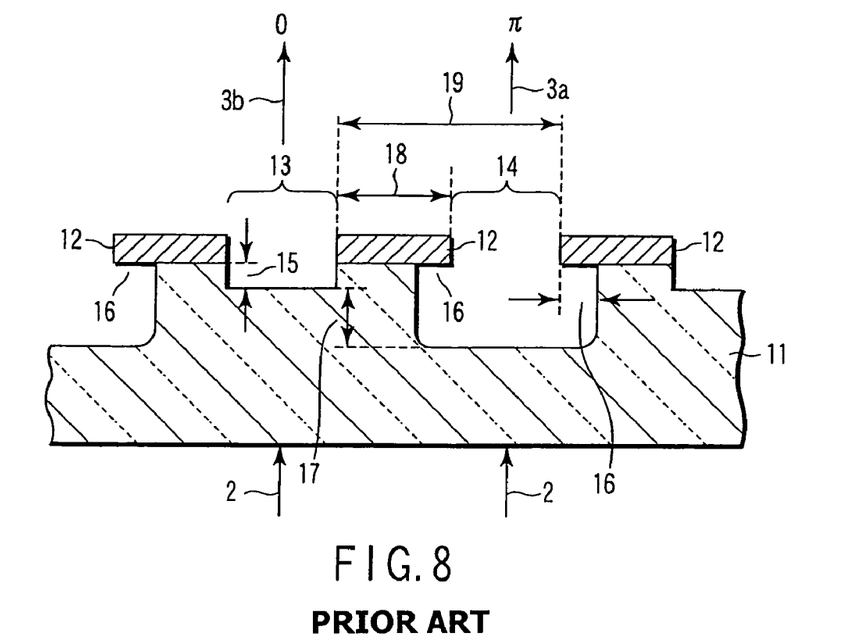
FIG. 8 is a schematic sectional view showing a conventional dug-type Levenson type phase shift mask.

FIG. 8 is a schematic sectional view showing the structure of a dug-type Levenson type phase shift mask. In the drawing, the numeral 11 denotes a transparent substrate, 12 denotes a light shielding film, 13 denotes a non-shifter opening, and 14 denotes a shifter opening. The numeral 15 denotes a shallow trench, which is the depth of the non-shifter opening 13 dug in the substrate. The numeral 16 denotes an undercut, which is the length of a visor of light shielding portions provided in the shifter opening 14. The numeral 17 denotes a difference in digging amounts (or etching amounts) corresponding to a phase difference of 180° between transmitted light 3b through the non-shifter opening 13 and transmitted light 3a through the shifter opening 14. The numeral 18 denotes a chromium critical dimension (CD, refers to a line width, for example, in the case of an isolated pattern of a line pattern), which is a line width dimension when chromium (Cr) is used for the light shielding film 12. The numeral 19 denotes a pitch, which is a distance from an end face of a light shielding pattern to an end face of a next light shielding pattern.

In the Levenson type phase shift mask shown in FIG. 8, a structure without the shallow trench 15 is a so-called single trench structure, while a structure with the shallow trench 15 is a so-called dual trench structure. In both structures, it is known to provide the undercut 16 as described in, for example, Patent document 1 in order to prevent imbalance of light shielding intensity due to the transmitted light from a sidewall of a dug portion of the substrate.

Figure 9:
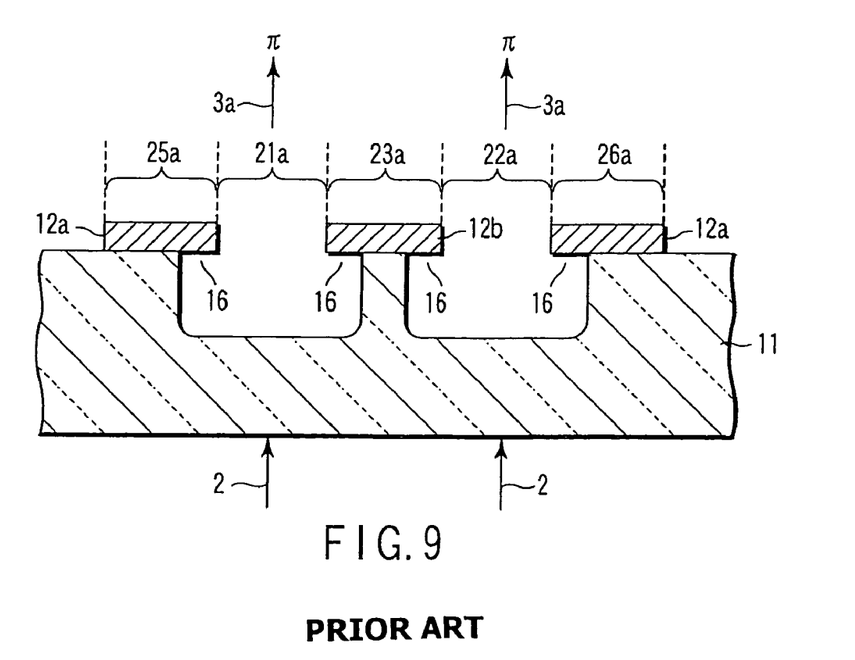
FIG. 9 is a sectional view showing a conventional Levenson type phase shift mask having a pattern in which shifter openings adjoin each other.

The dug-type Levenson type phase shift mask described above is based on a structure in which the shifter openings and the non-shifter openings are alternately arranged in a repetitive manner. However, in an actual design of a device circuit, there are created not only a pattern in which the shifter openings and the non-shifter openings are alternately arranged but also a pattern in which the shifter openings adjoin each other or a pattern in which the non-shifter openings adjoin each other. For example, as shown in FIG. 9, there may be created a pattern in which a shifter opening 21a adjoins another shifter opening 22a. It is often impossible in a circuit design to avoid the creation of such a pattern in which the openings of the same kind adjoin each other. The pattern in which the openings of the same kind adjoin each other has the following two problems.

Figure 10:
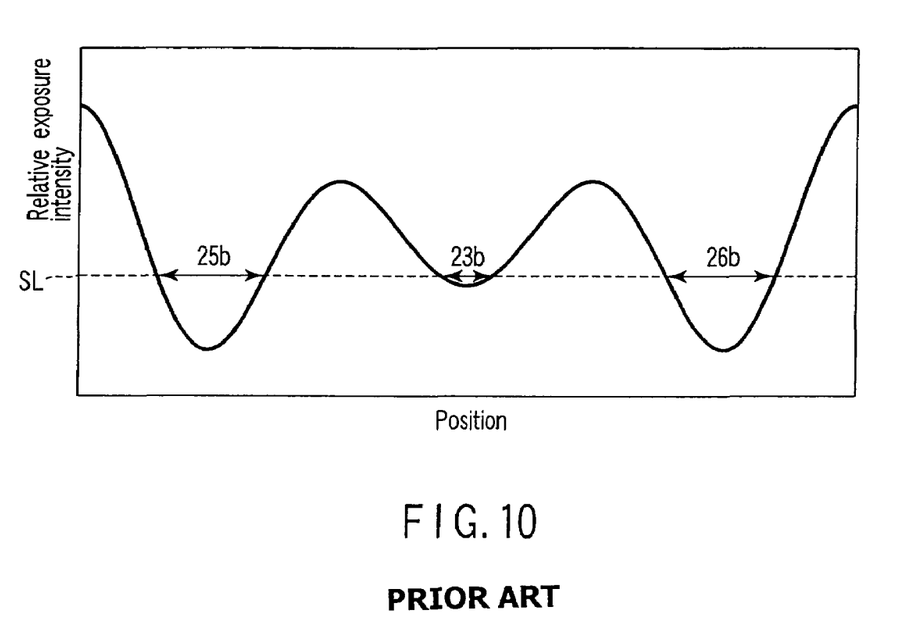
FIG. 10 is a characteristic diagram showing a relative exposure intensity when a positive resist is used to transfer the conventional mask having a structure of FIG. 9 onto a semiconductor wafer.

The first problem is that because the phases of transmitted lights 3a through the adjacent openings 21a and 22a are the same (π-π in the case of FIG. 9), they reinforce each other (not counteract each other), such that the light intensity in a portion 23a interposed between the openings of the same kind is increased, resulting in a degraded resolution quality of this interposed portion. FIG. 10 is a characteristic line diagram showing a relative exposure intensity when a positive resist is used to transfer a mask having the structure of FIG. 9 onto a semiconductor wafer. At the same threshold (SL), a resist CD 23b of the portion interposed between the shifter openings 21a and 22a of the same kind is smaller than resist CDs (transfer dimension of the resist) 25b and 26b of portions interposed between the shifter openings and the non-shifter openings, and the resolution is difficult in the former portion.

The second problem is that a light shielding film 12b present in the portion 23a interposed between the openings of the same kind easily comes off (or peels off). There is no problem when the non-shifter openings adjoin each other, but when the shifter openings 21a and 22a of the same kind adjoin each other as in the pattern shown in FIG. 9, the undercuts 16 are produced from both sides into the transparent substrate 11 in the portion 23a interposed between the two shifter openings 21a and 22a, such that a contact area between the light shielding film 12b and the transparent substrate 11 is reduced. Thus, the light shielding film 12b in the interposed portion 23a easily comes off from the transparent substrate 11. The mask design is greatly restricted due to countermeasures against the coming off of the light shielding film 12b, and the amount of the undercuts can not be properly selected, and moreover, the performance of the mask may deteriorate.

Patent document 1: Jpn. Pat. Appln. KOKAI Publication No. 10-333316

BRIEF SUMMARY OF THE INVENTION

In order to solve the foregoing problems, the present invention is directed to provide a Levenson type phase shift mask and a manufacturing method thereof which can improve a pattern resolution quality in a portion interposed between openings of the same kind and which can make it difficult for a light shielding film in the portion interposed between the openings of the same kind to come off.

(1) A Levenson type phase shift mask of the present invention is characterized by comprising light shielding portions and openings formed on a transparent substrate, the transparent substrate at the openings being partially dug in or a transparent film being partially disposed on the transparent substrate at the openings to form shifter openings and non-shifter openings, the shifter openings and the non-shifter openings repetitively existing in the mask, the shifter openings inverting a phase of transmitted light; the Levenson type phase shift mask including a light shielding portions pattern interposed from both sides between the adjacent openings of the same kind, the light shielding portions pattern being subjected to bias correction which expands the light shielding portions pattern to both sides thereof in a predetermined amount with respect to a predetermined design line width set by a design of the mask.

(2) The phase shift mask according to the above paragraph (1) is characterized in that a transfer dimension of the light shielding portions pattern interposed from both sides between the adjacent shifter openings or interposed from both sides between the adjacent non-shifter openings under predetermined exposure conditions is expressed as a function of the bias correction amount, and the bias correction amount is decided so that the light shielding portions pattern is obtained with a desired transfer dimension.

(3) The phase shift mask according to the above paragraph (2) is characterized in that the processing of deciding the bias correction amount is achieved by a simulation of transferring onto a semiconductor wafer.

Figure 1:
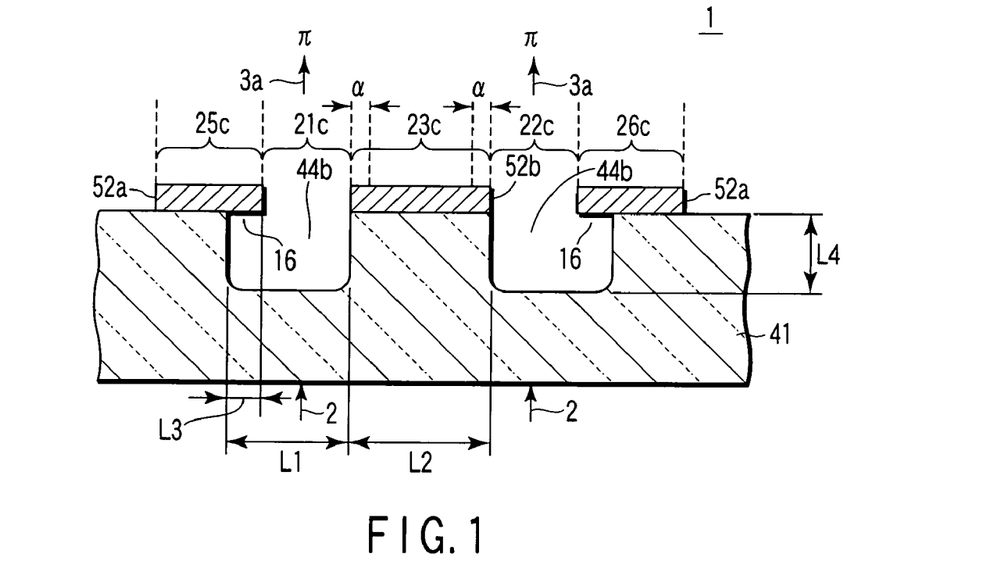
FIG. 1 is a sectional view showing a Levenson type phase shift mask in a first embodiment of the present invention.

(4) The phase shift mask according to any one of the above paragraphs (1 to 3) is a Levenson type phase shift mask wherein the light shielding portions pattern interposed from both sides between the adjacent shifter openings is subjected to the bias correction, the phase shift mask being characterized in that the light shielding portions pattern interposed between the shifter opening and the non-shifter opening has an undercut on the side of the shifter opening, and the light shielding portions pattern subjected to the bias correction has no undercut (FIG. 1).

Figure 2:
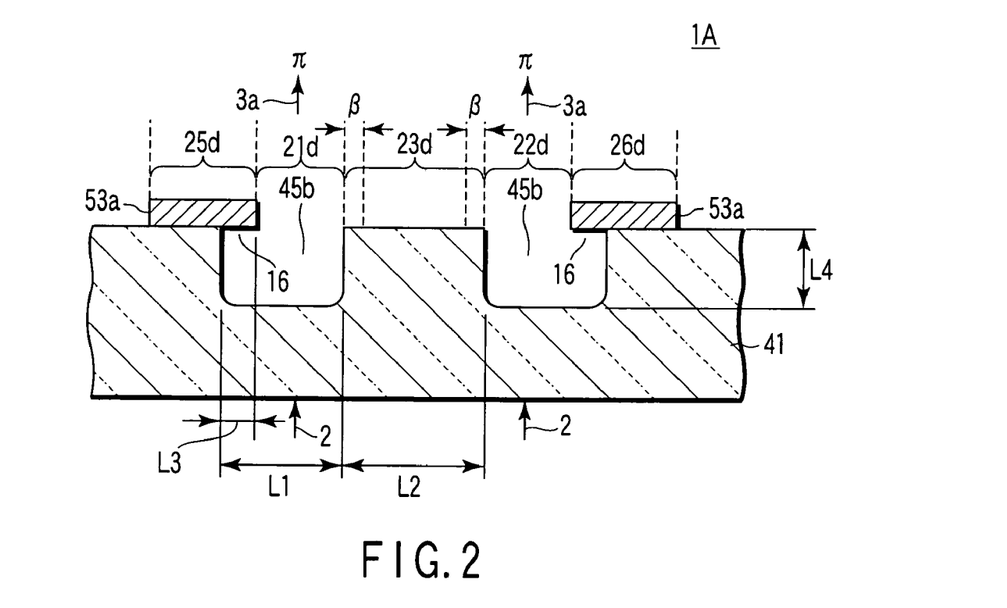
FIG. 2 is a sectional view showing a Levenson type phase shift mask in a second embodiment of the present invention.

(5) The phase shift mask according to any one of the above paragraphs (1 to 3) is a Levenson type phase shift mask wherein the light shielding portions pattern interposed from both sides between the adjacent shifter openings is subjected to the bias correction, the phase shift mask being characterized in that the light shielding portions pattern interposed between the shifter opening and the non-shifter opening has an undercut on the side of the shifter opening, and the light shielding portions pattern subjected to the bias correction has no light shielding film (FIG. 2). In this chromeless type phase shift mask, the transmitted light from the shifter opening and the transmitted light from the interposed portion offset each other. In consequence, the mask functions as if the light shielding film was present, though any light shielding film is not present in the interposed portion.

(6) A manufacturing method of a Levenson type phase shift mask according to the present invention is directed to a method of manufacturing a Levenson type phase shift mask comprising light shielding portions and openings formed on a transparent substrate, the transparent substrate at the openings being partially dug in or a transparent film being partially disposed on the transparent substrate at the openings to form shifter openings and non-shifter openings, the shifter openings and the non-shifter openings repetitively existing in the mask, the shifter openings inverting a phase of transmitted light, the method being characterized by comprising: pattern-etching a light shielding film formed on the transparent substrate, and forming a light shielding film pattern subjected to bias correction in an area where the light shielding portions pattern interposed from both sides between the adjacent openings of the same kind is to be formed; forming a resist pattern expanded to both sides thereof in an amount corresponding to undercuts on the light shielding film pattern; and using the resist pattern as a mask to dig in the transparent substrate by etching, forming undercuts in the resist pattern, and removing a resist of the resist pattern (FIGS. 6A to 6I).

(7) The method according to the above paragraph (6) is characterized by comprising: forming a resist pattern covering the light shielding film pattern except for the light shielding portions pattern interposed from both sides between the adjacent openings of the same kind after the resist of the resist pattern is removed; removing the light shielding film of the light shielding portions pattern by etching; and removing a resist of the resist pattern (FIGS. 6A to 6I).

(8) A manufacturing method of a Levenson type phase shift mask according to the present invention is directed to a method of manufacturing a Levenson type phase shift mask comprising light shielding portions and openings formed on a transparent substrate by pattern formation of a light shielding film, the transparent substrate at the openings being partially dug in or a transparent film being partially disposed on the transparent substrate at the openings to form shifter openings and non-shifter openings, the shifter openings and the non-shifter openings repetitively existing in the mask, the shifter openings inverting a phase of transmitted light, the method being characterized by comprising: pattern-etching a light shielding film formed on the transparent substrate, and removing a light shielding film from an area where a light shielding portions pattern interposed from both sides between the adjacent openings of the same kind is to be formed; giving bias correction onto the light shielding film removed area to form a resist pattern expanded to both sides thereof in an amount corresponding to undercuts; and using the resist pattern as a mask to dig in the transparent substrate by etching, forming undercuts in the resist pattern, and removing a resist of the resist pattern (FIGS. 7A to 7G).

(9) The method according to any one of the above paragraphs (6 to 8) is characterized in that a transfer dimension of the light shielding portions pattern interposed from both sides between the adjacent shifter openings or interposed from both sides between the adjacent non-shifter openings under predetermined exposure conditions is expressed as a function of the bias correction amount, and the bias correction amount is decided so that the light shielding portions pattern is obtained with a desired transfer dimension.

(10) The method according to the above paragraph (9) is characterized in that the processing of deciding the bias correction amount is achieved by a simulation of transferring onto a semiconductor wafer.

In the present specification, the "non-shifter opening" is defined to mean a pattern area which transmits light without changing the phase of the light. Moreover, in the present specification, the "shifter opening" is defined to mean a pattern area which transmits light so that the phase of the light is changed (the phase is modulated). For example, in the case of a dug-type Levenson type phase shift mask, the non-shifter opening corresponds to a pattern portion which is an area without a light shielding film and in which there is no digging or there is only formed a shallow trench if any. Further, the shifter opening corresponds to a pattern portion with a digging.

In the present specification, "NA" is defined to mean a numerical aperture given by the product of a sine $\sin \theta$ with an angle $\theta$ made by the radius of an aperture to incident light in an optical device and a refractive index n of a space between a lens and a processing target substrate.

In the present specification, "σ" is defined to mean a coherence factor given as a value wherein the numerical aperture of an illumination optical system is divided by the numerical aperture of a projection optical system.

In the present specification, "just focus" is defined to mean causing the focus of an exposure device optical system to coincide with the surface of a resist applied onto the processing target substrate in which a pattern is to be formed.

DETAILED DESCRIPTION OF THE INVENTION

Various preferred embodiments of the present invention will hereinafter be described in reference to the accompanying drawings.

First Embodiment

Type 1

As shown in FIG. 1, a Levenson type phase shift mask 1 of a first embodiment is a type in which a light shielding portions pattern 23c interposed from both sides between adjacent shifter openings 21c and 22c comprises a light shielding film pattern 52b, and this light shielding film pattern 52b has no undercut, and moreover, the light shielding portions pattern 23c has been subjected to bias correction $\alpha$. This will hereinafter be called Type 1.

In the mask 1 of Type 1, the light shielding film pattern 52b with no undercut is provided on one side of a dug portion 44b, and a light shielding film pattern 52a (light shielding portions pattern 25c) with an undercut 16 is provided on the other side of the dug portion 44b, and these patterns form the shifter opening 21c. In the same manner, the shifter opening 22c located on the other side across the light shielding portions pattern 23c is also formed by the light shielding film pattern 52b with no undercut and the light shielding film pattern 52a (light shielding portions pattern 26c) with the undercut 16.

Figure 4:
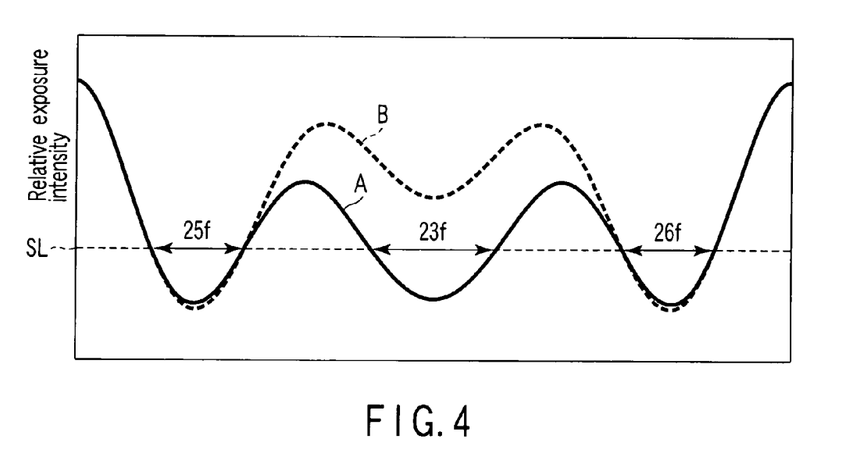
FIG. 4 is a characteristic diagram showing a relative exposure intensity when a positive resist is used to transfer the Levenson type phase shift mask of the present invention onto a semiconductor wafer.

According to the mask 1 of Type 1, because the bias correction $\alpha$ restrains lights 3a transmitted through the shifter openings 21c and 22c from reinforcing each other, a relative exposure intensity in the interposed portion is improved from a characteristic line B (broken line) to a characteristic line A (full line) as shown in FIG. 4, and a phase difference between the adjacent openings on both sides is not inverted, so that the resolution quality of a resist CD23f of the light shielding portions pattern 23c (pattern which is normally not easily resolved) is significantly improved. Moreover, in the mask of Type 1, since the light shielding film pattern 52b has no undercut in the light shielding portions pattern 23c, the light shielding film 52b does not easily come off from a transparent substrate 41.

Second Embodiment

Type 2

As shown in FIG. 2, a mask 1A of a second embodiment is a type in which a light shielding portions pattern 23d interposed from both sides between adjacent shifter openings 21d and 22d does not have any light shielding film, and the light shielding portions pattern 23d has been subjected to bias correction $\beta$. This will hereinafter be called Type 2.

In the mask 1A of Type 2, the light shielding portions pattern 23d with no light shielding film is provided on one side of a dug portion 45b, and a light shielding film pattern 53a (light shielding portions pattern 25d) with an undercut 16 is provided on the other side of the dug portion 45b, and these patterns form the shifter opening 21d. In the same manner, the shifter opening 22d located on the other side across the light shielding portions pattern 23d is also formed by the light shielding portions pattern 23d without a light shielding film and the light shielding film pattern 53a (light shielding portions pattern 26d) with the undercut 16.

The mask (chromeless type) 1A of Type 2 is effective when a line width of the interposed portion (the light shielding portions pattern 23d) is small, and transmitted lights 3a from the shifter openings 21d and 22d and transmitted light 3b from the non-shifter opening 23d counteract each other, thereby making it possible to obtain a sharp resolution quality as if a light shielding film were present despite the absence of the light shielding film in the interposed portion.

Third Embodiment

Type 3

Figure 3:
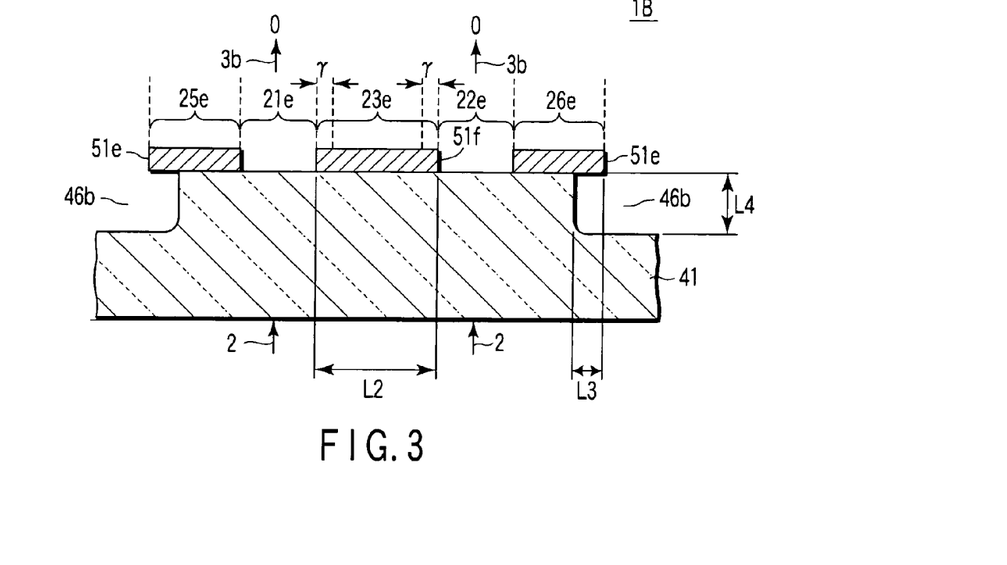
FIG. 3 is a sectional view showing a Levenson type phase shift mask in a third embodiment of the present invention.

As shown in FIG. 3, a mask 1B of a third embodiment is a type in which a light shielding portions pattern 23e interposed from both sides between adjacent non-shifter openings 21e and 22e has been subjected to bias correction γ. This will hereinafter be called Type 3.

In the mask 1B of Type 3, a light shielding film pattern 51f is provided not in a dug portion 46b serving as a shifter opening but in a flat area of a substrate 41 interposed from both sides between non-shifter openings 21e and 22e, thereby forming the light shielding portions pattern 23e. According to such a mask 1B of Type 3, it is also possible to obtain effects of improving a resolution quality and preventing the coming off of a light shielding film, as in the case of the mask 1A of Type 1 described above.

Next, there will be described a simulation of transferring onto a semiconductor wafer to obtain an optimum bias correction amount (α, β, γ). The optimum bias correction amount is obtained in a method in which a transfer dimension under predetermined exposure conditions of the pattern interposed between the adjacent shifter openings (or non-shifter openings) is expressed as a function of the bias correction amount. First, in the structure of an ordinary Levenson type phase shift mask in which the shifter openings and the non-shifter openings repetitively exist, a threshold is decided which makes it possible to obtain a resist CD exactly as a chromium CD on a photomask. When there is particularly a pattern to be resolved other than those of the above-mentioned structure, a threshold is decided at which that pattern is resolved with a desired resist CD.

Next, there is obtained a resist CD (transfer dimension of the resist) at the above-mentioned threshold of the pattern interposed from both sides between the openings of the same kind when the bias correction amount is variously changed in the structure in which the openings with the same phase adjoin each other as shown in FIG. 1 and FIG. 2 (or FIG. 3). The bias correction amount (α, β, γ) is decided for each mask type so that this resist CD can be obtained at a desired value (e.g., a threshold level line 31 in FIG. 5).

Figure 5:
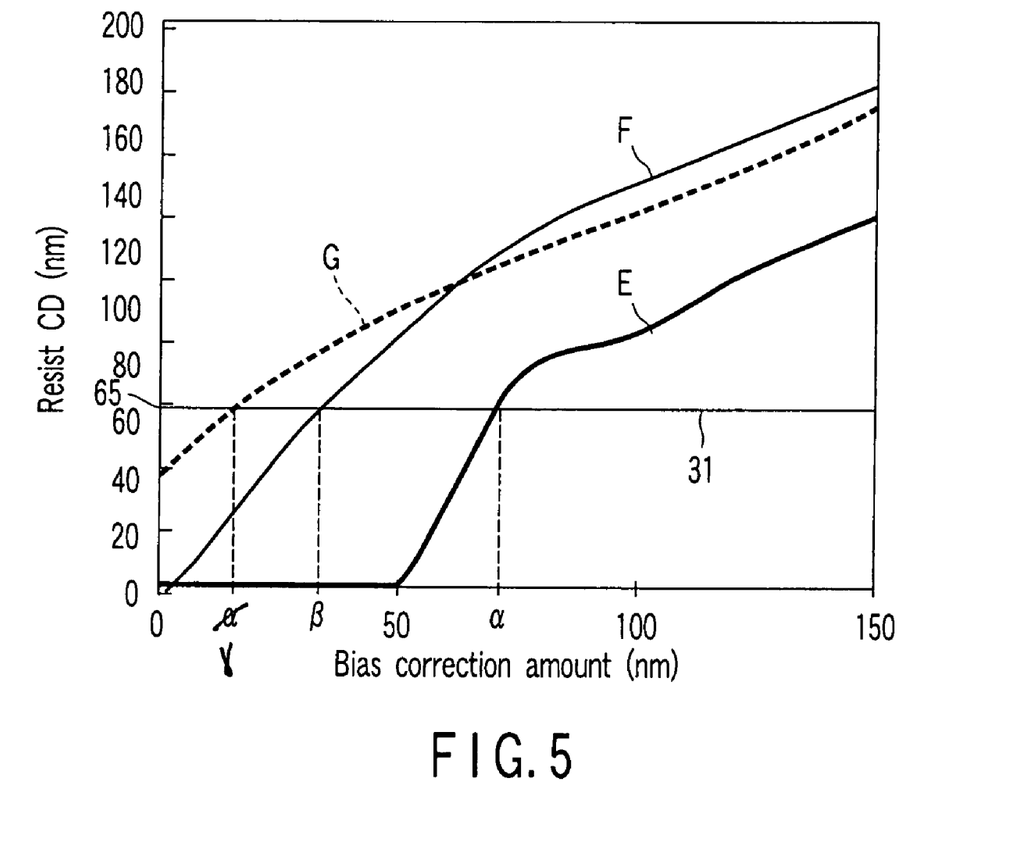
FIG. 5 is a characteristic diagram showing, with respect to the bias correction amount, a resist CD of a pattern interposed from both sides between openings of the same kind.

FIG. 5 is a characteristic line diagram showing results of examining, by use of a simulation, the change of the resist CD (transfer dimension of the resist) with respect to the bias correction amount, wherein a horizontal axis indicates the bias correction amount (nm), and a vertical axis indicates the resist CD (nm) of the pattern neighboring on both sides thereof the openings of the same kind. In the drawing, a characteristic line E (thick full line) corresponds to the phase shift mask 1 of Type 1, a characteristic line F (thin full line) corresponds to the phase shift mask 1A of Type 2, and a characteristic line G (a broken line) corresponds to the phase shift mask 1B of Type 3. The bias correction amount α, β, γ is obtained for the phase shift mask of each type from an intersection of the characteristic line E, F, G and the threshold level line 31 having a pattern minimum line width (65 nm). The model and exposure conditions of the Levenson type phase shift mask used in the simulation are shown below.

Chromium CD: 260 nm (size on photomask)
Pitch: 760 nm (size on photomask)
Shallow trench: 0 nm
Undercut: 100 nm (size on photomask)
Exposure wavelength: 193 nm
NA: 0.78
σ: 0.4
Exposure magnification: 4
Focus: just focus (Method of Manufacturing Masks of Types 1 and 2)

Next, a method of manufacturing the Levenson type phase shift masks of Types 1 and 2 will be described referring to FIG. 6A to FIG. 6I. The structure of the Levenson type phase shift mask is shown with a single trench.

Figure 6A:
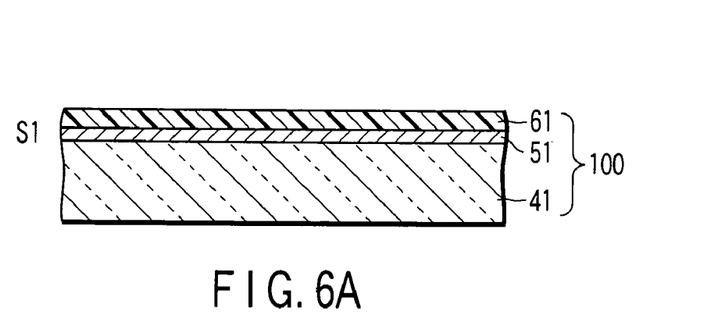
FIG. 6A is a process sectional view for explaining a method of manufacturing a Levenson type phase shift mask of the present invention.
Figure 6B:
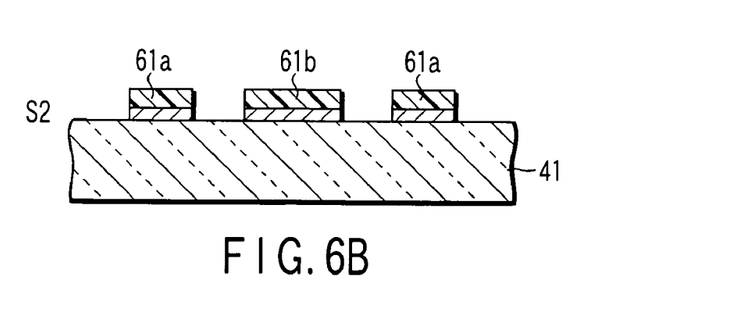
FIG. 6B is a process sectional view for explaining the method of manufacturing the Levenson type phase shift mask of the present invention.
Figure 6C:
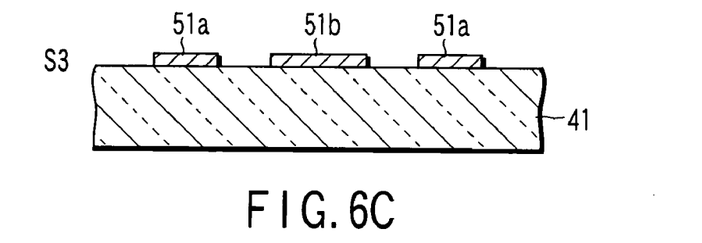
FIG. 6C is a process sectional view for explaining the method of manufacturing the Levenson type phase shift mask of the present invention.

First, a blank mask 100 is prepared (step S1). As shown in FIG. 6A, in the blank mask 100, a transparent substrate 41 made of synthetic quartz is covered with a light shielding film 51 comprising two layers of a chromium metal film and a chromium oxide film, onto which a resist layer 61 is further applied. This resist layer 61 is pattern-exposed by an electron beam, and a series of patterning processing such as development is carried out, thereby forming resist patterns 61a and 61b. Here, the resist pattern 61b has been subjected to an amount of bias correction obtained by the simulation of transferring onto the semiconductor wafer described above. Next, the light shielding film 51 is etched using the resist patterns 61a and 61b as masks, thereby forming a predetermined pattern shown in FIG. 6B (step S2). Then, the resist layer 61 is released with an exclusive releasing solution, and light shielding film patterns 51a and 51b are formed on the transparent substrate 41 shown in FIG. 6C (step S3).

Figure 6D:
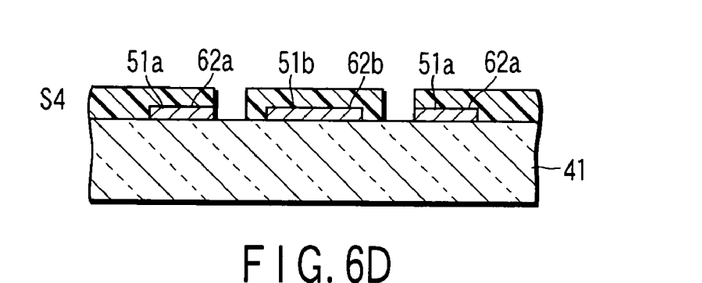
FIG. 6D is a process sectional view for explaining the method of manufacturing the Levenson type phase shift mask of the present invention.

Next, a resist layer 62 having a predetermined thickness is applied onto the processing target substrate, and this resist layer 62 is pattern-exposed by the electron beam, and a series of patterning processing such as development is carried out, thereby forming predetermined resist patterns 62a and 62b shown in FIG. 6D (step S4). Here, the resist pattern 62b is formed so that it is expanded to both sides thereof in the amount corresponding to undercuts (UC), anticipating that the resist pattern 62b is later processed to form the undercuts.

Figure 6E:
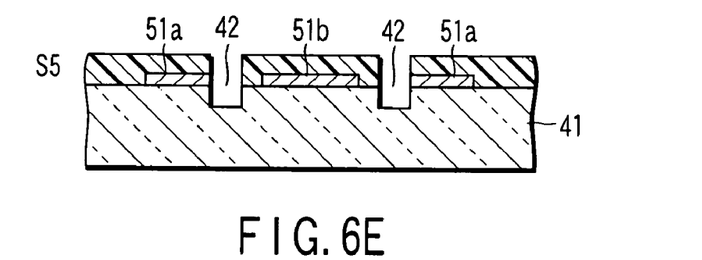
FIG. 6E is a process sectional view for explaining the method of manufacturing the Levenson type phase shift mask of the present invention.

Next, the transparent substrate 41 is subjected to dry etching using the resist patterns 62a and 62b as masks, thereby forming diggings 42 shown in FIG. 6E (step S5). Here, the etching treatment is controlled to form the diggings 42 so that Equation (1) below is satisfied:

$$d = \lambda/2(n-1) - UC \qquad (1)$$

wherein d is the depth of the digging 42, UC is the amount of the undercut, λ is the exposure wavelength, and n is the refractive index of the transparent substrate.

Figure 6F:
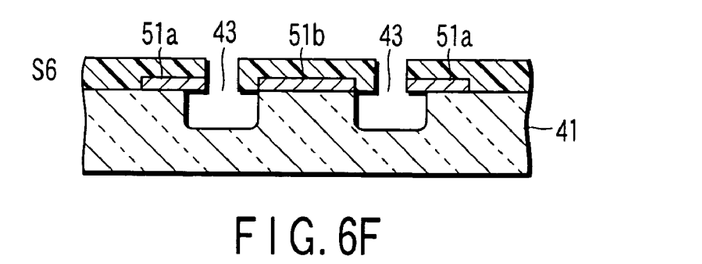
FIG. 6F is a process sectional view for explaining the method of manufacturing the Levenson type phase shift mask of the present invention.

Next, the transparent substrate 41 is subjected to wet etching using the resist patterns 62a and 62b as masks, thereby forming diggings 43 having undercuts as shown in FIG. 6F (step S6).

Figure 6G:
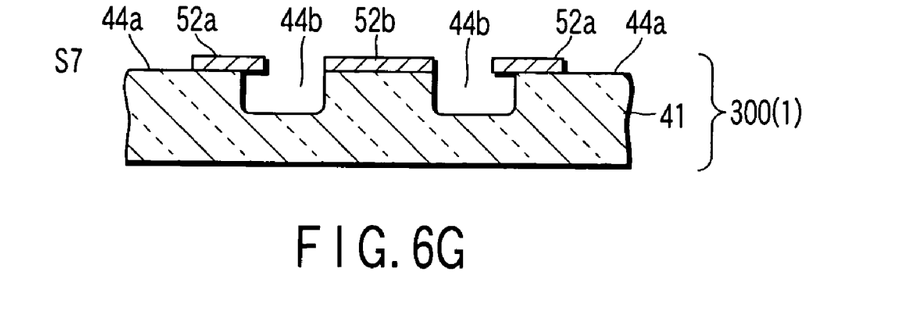
FIG. 6G is a process sectional view for explaining the method of manufacturing the Levenson type phase shift mask of the present invention.

Next, the resist layer 62 is released with an exclusive releasing solution, thereby obtaining a Levenson type phase shift mask 300 in which the light shielding film patterns 52a and 52b, non-shifter openings 44a and the shifter openings 44b are formed on the transparent substrate 41 as shown in FIG. 6G (step S7). This mask 300 corresponds to the mask 1 of Type 1 described above. In the mask 300 (1), the pattern 52b interposed from both sides between the shifter openings 44b has no undercut, and the pattern 52b has been subjected to the bias correction α.

Figure 6H:
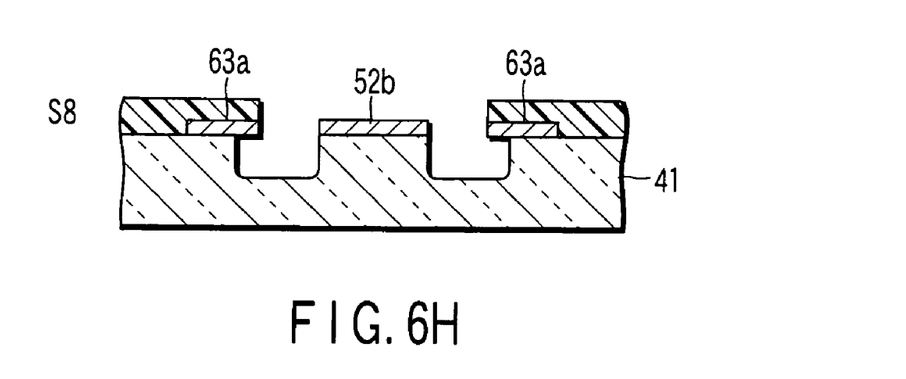
FIG. 6H is a process sectional view for explaining the method of manufacturing the Levenson type phase shift mask of the present invention.
Figure 6I:
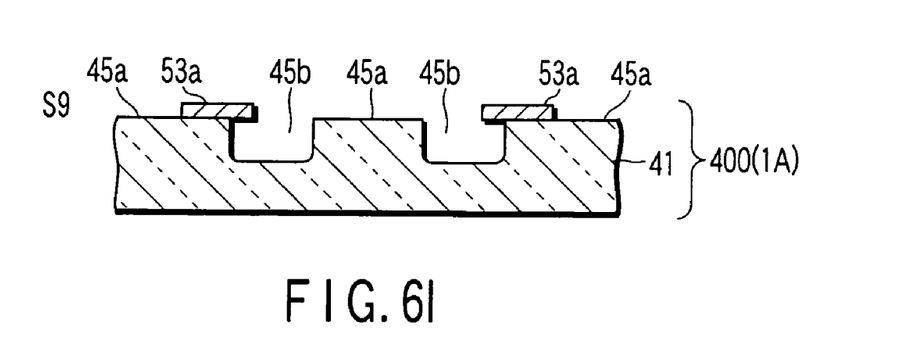
FIG. 6I is a process sectional view for explaining the method of manufacturing the Levenson type phase shift mask of the present invention.

Furthermore, the following processing is additionally performed to obtain the mask of Type 2. First, a resist layer 63 is applied onto and formed on the mask 300, and the resist skin 63 is pattern-exposed by the electron beam and a series of patterning processing such as development is carried out to form a resist pattern 63a, and then the light shielding film 52b is removed by etching using the resist pattern 63a as a mask (step S8). Then, the resist layer 63 is released with an exclusive releasing solution, thereby obtaining a Levenson type phase shift mask 400 in which the light shielding film patterns 53a, non-shifter openings 45a and shifter openings 45b are formed on the transparent substrate 41 as shown in FIG. 6I (step S9). This mask 400 corresponds to the Levenson type phase shift mask 1A of Type 2.

(Another Method of Manufacturing Mask of Type 2)

Next, another method of manufacturing a Levenson type phase shift mask of type 2 shown in FIG. 2 will be described referring to FIG. 7A to FIG. 7G.

The same blank mask 100 as that described above is prepared as shown in FIG. 7A (step S21). A resist layer 61 on the blank mask 100 is pattern-exposed by the electron beam, and a series of patterning processing such as development is carried out, thereby forming resist patterns 61a. Then, a light shielding film 51 is etched using resist patterns 61a as masks, thereby forming a predetermined pattern shown in FIG. 7B (step S22). Then, the resist layer 61 is released with an exclusive releasing solution, thereby manufacturing light shielding film patterns 51a on a transparent substrate 41 shown in FIG. 7C (step S23).

Figure 7A:
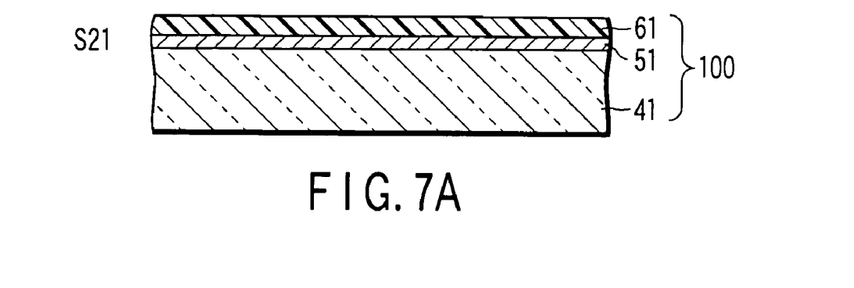
FIG. 7A is a process sectional view for explaining a method of manufacturing an alternative Levenson type phase shift mask of the present invention.
Figure 7B:
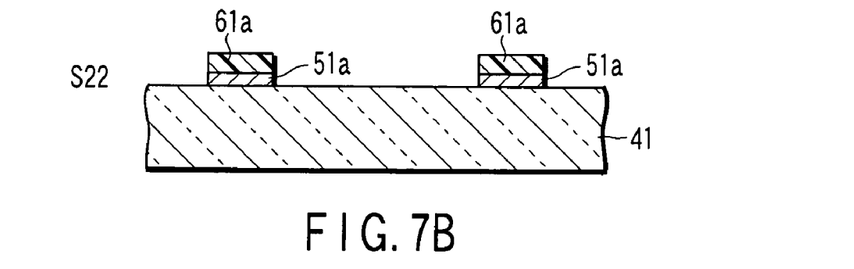
FIG. 7B is a process sectional view for explaining the method of manufacturing the alternative Levenson type phase shift mask of the present invention.
Figure 7C:
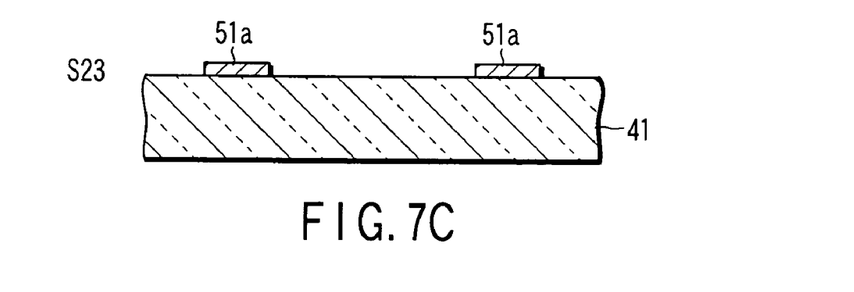
FIG. 7C is a process sectional view for explaining the method of manufacturing the alternative Levenson type phase shift mask of the present invention.
Figure 7D:
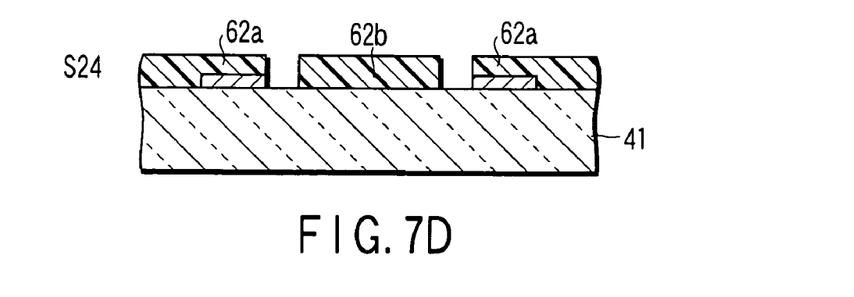
FIG. 7D is a process sectional view for explaining the method of manufacturing the alternative Levenson type phase shift mask of the present invention.

Next, a resist layer 62 having a predetermined thickness is applied onto the processing target substrate, and this resist layer 62 is pattern-exposed by the electron beam, and a series of patterning processing such as development is carried out, thereby forming predetermined resist patterns 62a and 62b shown in FIG. 7D (step S24). Here, the resist pattern 62b has been subjected to an amount of bias correction β obtained by a simulation of transferring onto a semiconductor wafer. Moreover, the resist pattern 62b is formed so that it is expanded to both sides thereof in the amount corresponding to undercuts (UC), anticipating that the resist pattern 62b is processed to form the undercuts in a subsequent step.

Figure 7E:
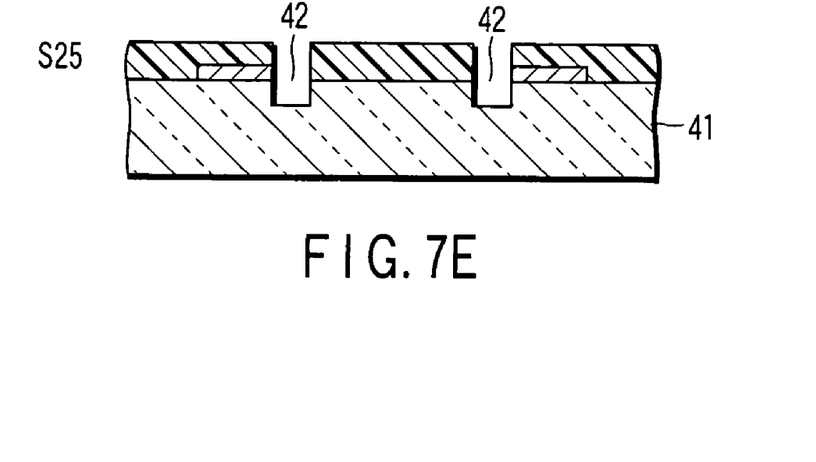
FIG. 7E is a process sectional view for explaining the method of manufacturing the alternative Levenson type phase shift mask of the present invention.

Next, the transparent substrate 41 is subjected to dry etching using the resist patterns 62a and 62b as masks, thereby forming diggings 42 shown in FIG. 7E (step S25). A depth d of the digging 42 is controlled in accordance with Equation (1) above.

Figure 7F:
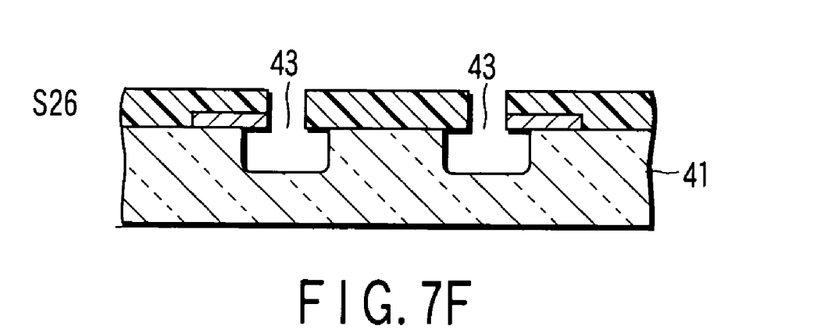
FIG. 7F is a process sectional view for explaining the method of manufacturing the alternative Levenson type phase shift mask of the present invention.

Next, the transparent substrate 41 is subjected to wet etching using the resist patterns 62a and 62b as masks, thereby forming diggings 43 having undercuts as shown in FIG. 7F (step S26).

Figure 7G:
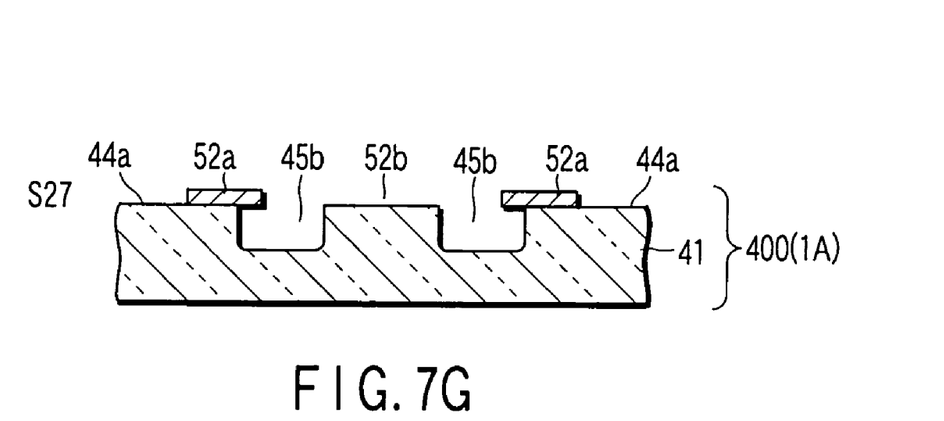
FIG. 7G is a process sectional view for explaining the method of manufacturing the alternative Levenson type phase shift mask of the present invention.

Finally, the resist layer 62 is released with an exclusive releasing solution, thereby obtaining a Levenson type phase shift mask 400 (1A) of Type 2 in which light shielding film patterns 52a, non-shifter openings 44a and shifter openings 44b are formed on the transparent substrate 41 as shown in FIG. 7G (step S27).

The present invention can provide a Levenson type phase shift mask and a manufacturing method thereof for use in the manufacture of a semiconductor element such as an LSI. The types shown in FIGS. 1 to 3 can all be applied to a dug-type Levenson type phase shift mask. It is to be noted that the types shown in FIGS. 1 and 2 can also be applied to a top mounting type Levenson type phase shift mask.

According to the present invention, the pattern 23a, 23c, 23d interposed from both sides between the shifter openings or the pattern 23e interposed from both sides between the non-shifter openings is subjected to the bias correction α, β, γ for expanding the pattern to both sides thereof in a predetermined amount. Thus, a relative exposure intensity in the interposed area is improved from the characteristic line B (broken line) to the characteristic line A (full line) as shown in FIG. 4, and the resolution quality of a resist CD23f in the interposed portion 23c, 23d, 23e (not easily resolved because a phase difference between the adjacent openings on both sides is not inverted) can be significantly improved.

Furthermore, according to the present invention, since the pattern in the portion 23c interposed from both sides between the non-shifter openings 21c and 22c has no undercut, the light shielding film 52b in this portion does not come off. That is, it is possible to reduce defects in which the light shielding film interposed between the shifter openings comes off when the undercuts are formed in the shifter openings, and it is also possible to properly select the amount of the undercuts with more freedom without being limited by the coming off of the light shielding film.

Still further, according to the present invention, since the pattern in the portion 23d in the portion interposed from both sides between the shifter openings 21d and 22d has no undercut, the coming off of the light shielding film itself does not occur. That is, it is possible to reduce defects in which the light shielding film comes off when the undercuts are formed, and it is also possible to properly select the amount of the undercuts with more freedom without being limited by the coming off of the light shielding film. Moreover, a phase difference of lights transmitted through this portion 23d is 0°, and a phase difference between lights transmitted through the openings 21d and 22d on both sides is 180° resulting in an inverted phase, thus providing a good resolution quality.

Hereinafter, various examples of the present invention will be described.

Example 1

Example 1 is described wherein a resist pattern is formed on a wafer using a Levenson type phase shift mask of the present invention. A mask 1 of Type 1 shown in FIG. 1 was produced by the manufacturing method described above. At this moment, no defect was caused due to the coming off of a light shielding film pattern of the produced mask.

The mask 1 of Type 1 having the following sizes was obtained.

Thickness of a transparent substrate: 6350 μm
Pitch: 760 nm
Digging width L1: 531 nm
Width L2 of a light shielding portion: 398 nm
Undercut length L3: 100 nm
Digging depth L4: 172 nm
Design line width of the mask: 260 nm Then, an antireflection film and a resist were applied onto a silicon substrate, and the resist was exposed using an exposure device. Exposure conditions were as follows.

Exposure wavelength: 193 nm (ArF excimer laser)
NA: 0.78

σ: 0.4
Exposure magnification: 4
Bias correction amount α: 69 nm
After this, development was carried out, and the resist pattern was formed.
In this resist pattern, the resolution quality of the pattern interposed between openings of the same kind (π-π phase shift) was improved as shown by a characteristic line A in FIG. 4, and accuracy was satisfactory.

Example 2

An example is shown wherein a resist pattern is formed on a wafer using a Levenson type phase shift mask of the present invention. A mask 1A of Type 2 shown in FIG. 2 was produced by the manufacturing method described above. At this moment, no defect was caused due to the coming off of a light shielding film pattern of the produced mask.
The mask 1A of Type 2 having the following sizes was obtained.
 Thickness of a transparent substrate: 6350 μm
 Pitch: 760 nm
 Digging width L1: 569 nm
 Width L2 of a light shielding portion: 322 nm
 Undercut length L3: 100 nm
 Digging depth L4: 172 nm
 Design line width of the mask: 260 nm
Then, an antireflection film and a resist were applied onto a silicon substrate, and the resist was exposed using an exposure device. Exposure conditions were as follows.
 Exposure wavelength: 193 nm (ArF excimer laser)
 NA: 0.78
 σ: 0.4
 Exposure magnification: 4
 Bias correction amount β: 31 nm
After this, development was carried out, and the resist pattern was formed.
In this resist pattern, the resolution quality of the pattern interposed between openings of the same kind (π-π phase shift) was improved as shown by a characteristic line A in FIG. 4, and accuracy was satisfactory.

Example 3

An example is shown wherein a resist pattern is formed on a wafer using a Levenson type phase shift mask of the present invention. A mask 1B of Type 3 shown in FIG. 3 was produced by a usual method of a photolithographic process (e.g., a method described in Patent document 1). At this moment, no defect was caused due to the coming off of a light shielding film pattern of the produced mask.
The mask 1B of Type 3 having the following sizes was obtained.
 Thickness of a transparent substrate: 6350 μm
 Pitch: 760 nm
 Width L2 of a light shielding portion: 286 nm
 Undercut length L3: 100 nm
 Digging depth L4: 172 nm
 Design line width of the mask: 260 nm
Then, an antireflection film and a resist were applied onto a silicon substrate, and the resist was exposed using an exposure device. Exposure conditions were as follows.
 Exposure wavelength: 193 nm (ArF excimer laser)
 NA: 0.78
 σ: 0.4
 Exposure magnification: 4
 Bias correction amount γ: 13 nm
After this, development was carried out, and the resist pattern was formed.
In this resist pattern, the resolution quality of the pattern interposed between openings of the same kind (0-0 phase shift) was improved as shown by a characteristic line A in FIG. 4, and accuracy was satisfactory.

What is claimed is:
1. A Levenson type phase shift mask comprising light shielding portions and openings formed on a transparent substrate, the transparent substrate at the openings being partially dug in or a light shielding film being partially disposed on the transparent substrate at the openings to form shifter openings and non-shifter openings, the shifter openings and the non-shifter openings repetitively existing in the mask, the shifter openings inverting a phase of transmitted light, the Levenson type phase shift mask having:
 a first light shielding portions pattern disposed between the adjacent shifter openings of the same kind, and a second light shielding portions pattern disposed between the shifter opening and the non-shifter opening;
 the first light shielding portions pattern being subjected to bias correction which expands the first light shielding portions pattern to both sides thereof in a predetermined amount with respect to a predetermined design line width set by a design of the mask, and the first light shielding portions pattern having no undercut on the side of the shifter opening; and
 the second light shielding portions pattern having an undercut on the side of the shifter opening.
2. A Levenson type phase shift mask comprising light shielding portions and openings formed on a transparent substrate, the transparent substrate at the openings being partially dug in or a light shielding film being partially disposed on the transparent substrate at the openings to form shifter openings and non-shifter openings, the shifter openings and the non-shifter openings repetitively existing in the mask, the shifter openings inverting a phase of transmitted light, the Levenson type phase shift mask having:
 a first light shielding portions pattern disposed between the adjacent shifter openings of the same kind, and a second light shielding portions pattern disposed between the shifter opening and the non-shifter opening;
 the first light shielding portions pattern being subjected to bias correction which expands the first light shielding portions pattern to both sides thereof in a predetermined amount with respect to a predetermined design line width set by a design of the mask, and the first light shielding portions pattern having no light shielding film; and
 the second light shielding portions pattern having an undercut on the side of the shifter opening.
3. A method of manufacturing a Levenson type phase shift mask comprising light shielding portions and openings formed on a transparent substrate, the transparent substrate at the openings being partially dug in or a light shielding film being partially disposed on the transparent substrate at the openings to form shifter openings and non-shifter openings, the shifter openings and the non-shifter openings repetitively existing in the mask, the shifter openings inverting a phase of transmitted light, the method comprising:
 pattern-etching the light shielding film formed on the transparent substrate, and forming a light shielding film pattern subjected to bias correction in an area between the adjacent shifter openings of the same kind;

forming, on the light shielding film pattern, a resist pattern expanded to both sides thereof from the light shielding film pattern in an amount corresponding to undercuts; and using the resist pattern as a mask to dig in the transparent substrate by etching, forming undercuts in the resist pattern, removing a resist of the resist pattern, and forming the light shielding portions pattern having no undercut between the adjacent shifter openings of the same kind.

4. The method according to claim 3, comprising: further forming a resist pattern covering the light shielding film pattern except for the light shielding portions pattern between the adjacent shifter openings of the same kind after the resist of the resist pattern is removed; removing the light shielding film of the light shielding portions pattern by etching; and removing a resist of the resist pattern.

5. A method of manufacturing a Levenson type phase shift mask comprising light shielding portions and openings formed on a transparent substrate by pattern formation of a light shielding film, the transparent substrate at the openings being partially dug in or a light shielding film being partially disposed on the transparent substrate at the openings to form shifter openings and non-shifter openings, the shifter openings and the non-shifter openings repetitively existing in the mask, the shifter openings inverting a phase of transmitted light, the method comprising:

pattern-etching the light shielding film formed on the transparent substrate, and removing the light shielding film from an area between the adjacent shifter openings of the same kind;

giving bias correction onto the light shielding film removed area to form a resist pattern expanded to both sides thereof in an amount corresponding to undercuts; and using the resist pattern as a mask to dig in the transparent substrate by etching, forming undercuts in the resist pattern, removing a resist of the resist pattern, and forming the light shielding portions pattern having no light shielding film between the adjacent shifter openings of the same kind.

6. The method according to claim 3, wherein a transfer dimension of the light shielding portions pattern interposed from both sides between the adjacent shifter openings or interposed from both sides between the adjacent non-shifter openings under predetermined exposure conditions is expressed as a function of the bias correction amount, and the bias correction amount is decided so that the light shielding portions pattern is obtained with a desired transfer dimension.

7. The method according to claim 6, wherein the processing of deciding the bias correction amount is achieved by a simulation of transferring onto a semiconductor wafer.

8. The method according to claim 7, comprising:

deciding a threshold such that a transfer dimension of the resist is obtained exactly as a chromium critical dimension on a photomask or deciding a threshold such that a particular pattern is resolved with a desired resist critical dimension;

obtaining a transfer dimension of the resist at the threshold of the pattern interposed from both sides between the openings of the same kind when the bias correction amount is changed in a pattern structure in which the openings with the same phase adjoin each other; and deciding the bias correction amount for each mask type so that the resist transfer dimension is obtained at a desired threshold level value.

\* \* \* \* \*